United States Patent

Schuler

[15] 3,699,394

[45] Oct. 17, 1972

[54] MODULAR CIRCUIT PACKAGE WITH ENHANCED HEAT DISSIPATION

[72] Inventor: Chester L. Schuler, Wayland, Mass.

[73] Assignee: Powercube Corporation, Waltham, Mass.

[22] Filed: Nov. 1, 1971

[21] Appl. No.: 194,728

[52] U.S. Cl. ................................317/100, 174/52 PE

[51] Int. Cl. ................................................H05k 7/20

[58] Field of Search .317/100, 101 D, 120; 174/15 R, 174/16 R, DIG. 5, 52 PE

[56] References Cited

UNITED STATES PATENTS

| | | | |
|---|---|---|---|
| 3,328,642 | 6/1967 | Haumesser | 317/100 |
| 3,164,750 | 1/1965 | Miller | 317/101 D |

*Primary Examiner*—Lewis H. Myers
*Assistant Examiner*—Gerald P. Tolin
*Attorney*—Joseph Weingarten et al.

[57] ABSTRACT

A modular electronic power circuit package having the individual circuit components mounted to a carrier which is secured to a base member. The carrier and base member provide a direct path to the chassis for dissipation of heat generated by circuit components, some of which may be physically connected to the carrier. Modular ceramic elements may be selectively utilized within the enclosure to provide physical and thermal connection and electrical insulation between the carrier and selective circuitry components. A preferred embodiment includes a housing within which one or more modular circuits and carriers may be mounted. The housing provides for various external physical mountings, and several housings (with subcircuits) may be interconnected and mechanically secured together to form more complex power circuit combinations. The complete enclosure effectively shields against radio frequency interference while enhancing heat dissipation.

20 Claims, 8 Drawing Figures

MODULAR CIRCUIT PACKAGE WITH ENHANCED HEAT DISSIPATION

FIELD OF THE INVENTION

This invention relates in general to electronic circuit packaging and more particularly to a unique and very flexible circuit packaging system which is compact and efficient for relatively high power circuits and is readily adapted to employ different circuits or different combinations of sub-circuits within a single enclosure. This modular circuit package provides for component mounting, heat removal, electrical shielding and a means for containing an encapsulant for protection of circuit components, all at a relatively low cost.

DISCUSSION OF THE PRIOR ART

While considerable success has been realized in the miniaturization of electronic apparatus for low power signal and logic circuitry, the same success, with some notable exceptions, is not evident in the relatively high power field. One factor in the inability to completely miniaturize electronic power circuits is the difficulty in the dissipation of heat generated by some electronic circuit components and the related problems which arise when high power heat generating elements are placed in close proximity to other components, especially those which are temperature sensitive. Another related problem is that where the size/weight reduction desired has been approached, a certain design rigidity has occurred in the size of the packaging and consequently there are significant limitations in the type and complexity of the circuits which may be included therein.

Some efforts have been directed to the miniaturization of portions of power circuits, that is, those portions which include the active circuit components such as some of the resistors, diodes, transistors, and capacitors, while leaving out the coils, filter capacitors, transformers and some driving resistors which must be provided separately. Only a part of such power circuits have thus been engineered for the desired size/weight reduction leaving the end user to provide his own space engineering for the more bulky components, some of which are heat generating.

SUMMARY OF THE INVENTION

This invention provides an integrated, modular electronic power circuit package featuring relatively high power rating, minimum size and weight, compact appearance and flexibility of circuit design. Not only is the modular circuit package of this invention particularly effective for heat dissipation to provide high power in a small volume, but the structural characteristics permit sub-circuit assemblies to be interconnected within a single complete power unit to thereby make up a significantly more complex circuit than would normally be expected. The feature of practical flexibility combined with structural modularity are significant aspects of the present invention.

Broadly speaking this modular circuit package comprises a base member having a serrated upper surface and a carrier with a cooperating serrated lower surface mounted to the base member, the modular power circuit or sub-circuit being constructed upon the carrier. With a predetermined size for the base, carrier elements of various lengths may be mounted to a single base to combine two or more different sub-circuits for added flexibility in the overall modular circuit package system. It is possible to have a single carrier substantially occupying all of the upper serrated surface of the base having one single modular circuit mounted thereon. It is also possible to have two or more carriers with individual circuits or sub-circuits mounted to the same base member. These sub-circuits may be either mutually interconnected or have leads for external connections as desired.

An adaptation of the above modular circuit concepts includes a housing which secures to the base member and encloses the entire carrier or carriers and the circuits mounted thereto. The leads of the circuits extend through an opening in the top of the housing for external connections. The housing and base are interconnected in a unique manner to provide appropriate electrical as well as physical interrelationships. The combination of the base and carrier with the housing affords additional flexibility for physical connections to a chassis or other elements as well as providing effective radio frequency interference (RFI) shielding. Furthermore, the modularity concept continues to apply when the housing is used, the same as described above for the basic combination of base and carrier.

Additional external structural elements may be employed either for added heat dissipation or for mechanically connecting two or more of the units in the housings into a larger power package. When two or more such units are interconnected, the thus modified structure provides further enhanced RFI shielding.

This invention permits intricate problems of space interrelationships, mechanical mounting, circuit isolation, interference matching and thermal dissipation to be solved in advance for many circuit uses, thus freeing the engineer and circuit designer from those particular problems so that they may concentrate more on the overall system with which they may be working. However, with the inherent flexibility of this system a circuit designer is free to use various power circuits, comprised of several different sub-circuits, still within the confines of the space he has available.

BRIEF DESCRIPTION OF THE DRAWING

The objects, advantages and features of this invention will become apparent from the following detailed description when read in conjunction with the accompanying drawing, in which.

DESCRIPTION OF THE PREFERRED EMBODIMENTS

Figures 6, 7:
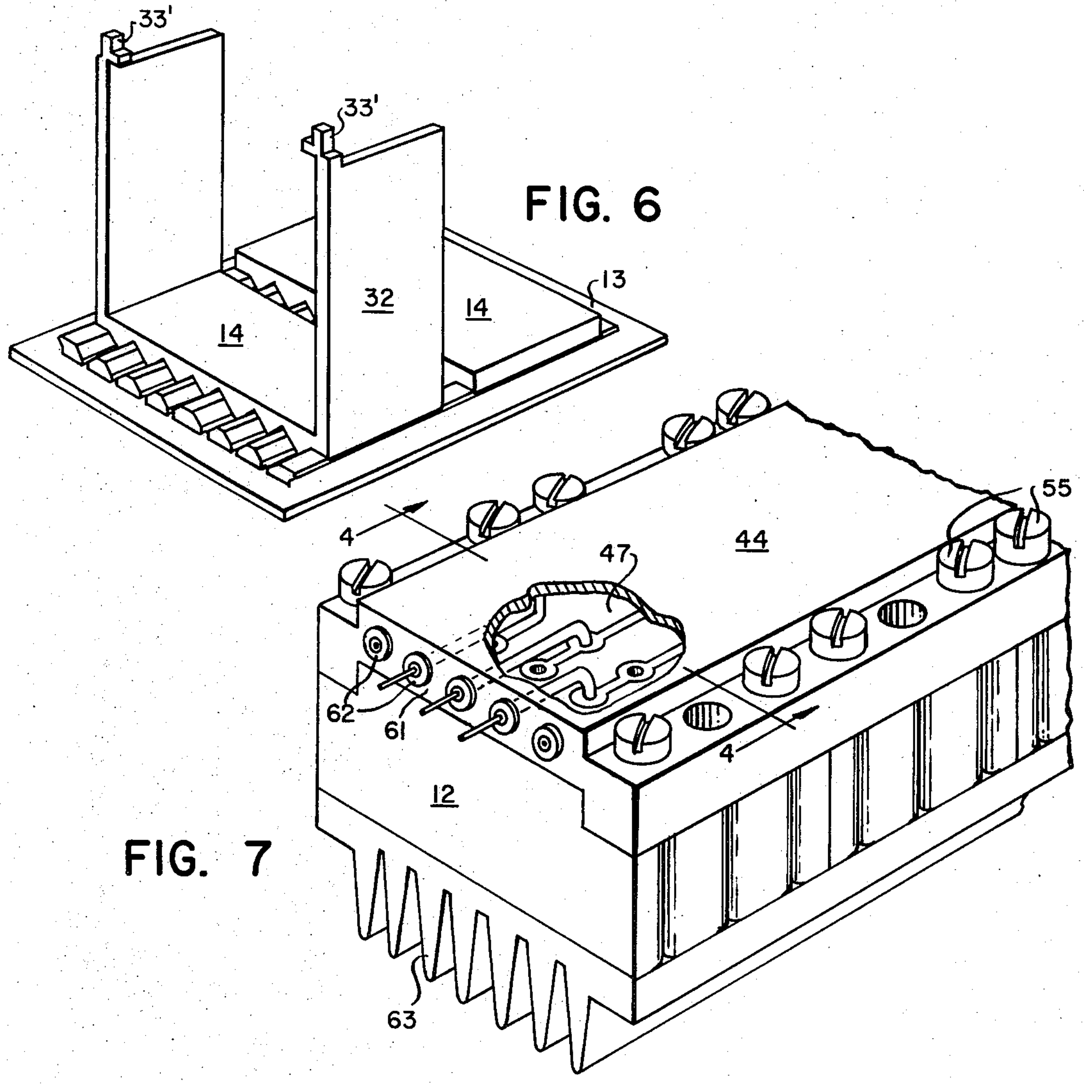
FIG. 6 is a perspective view of a base member with two carriers of different configurations as they may be employed in a preferred embodiment of this invention, but without circuit components.
FIG. 7 is a partially cut-away perspective view of the embodiment of FIG. 4 showing several modular circuit packages secured together, with the addition of a cooling fin element.

With reference now to the drawing, there is shown a modular circuit package 11 generally comprising housing 12, base member 13 and carrier 14. The structural details of these elements are clearly shown in FIGS. 2, 3, 5, and 6. With specific reference to FIGS. 4 and 6, it may be seen that at least two carriers 14 may be secured to one base and mounted within a single housing. Each carrier has an appropriate sub-circuit mounted thereto for ready assembly as part of the complete modular circuit package. It should be understood that the base and carrier elements as shown in FIG. 6, together with the appropriate circuits, comprise the essential aspects of the invention, but that the embodiment shown in FIG. 1, wherein the housing is employed, is normally preferred.

Figures 4, 5:
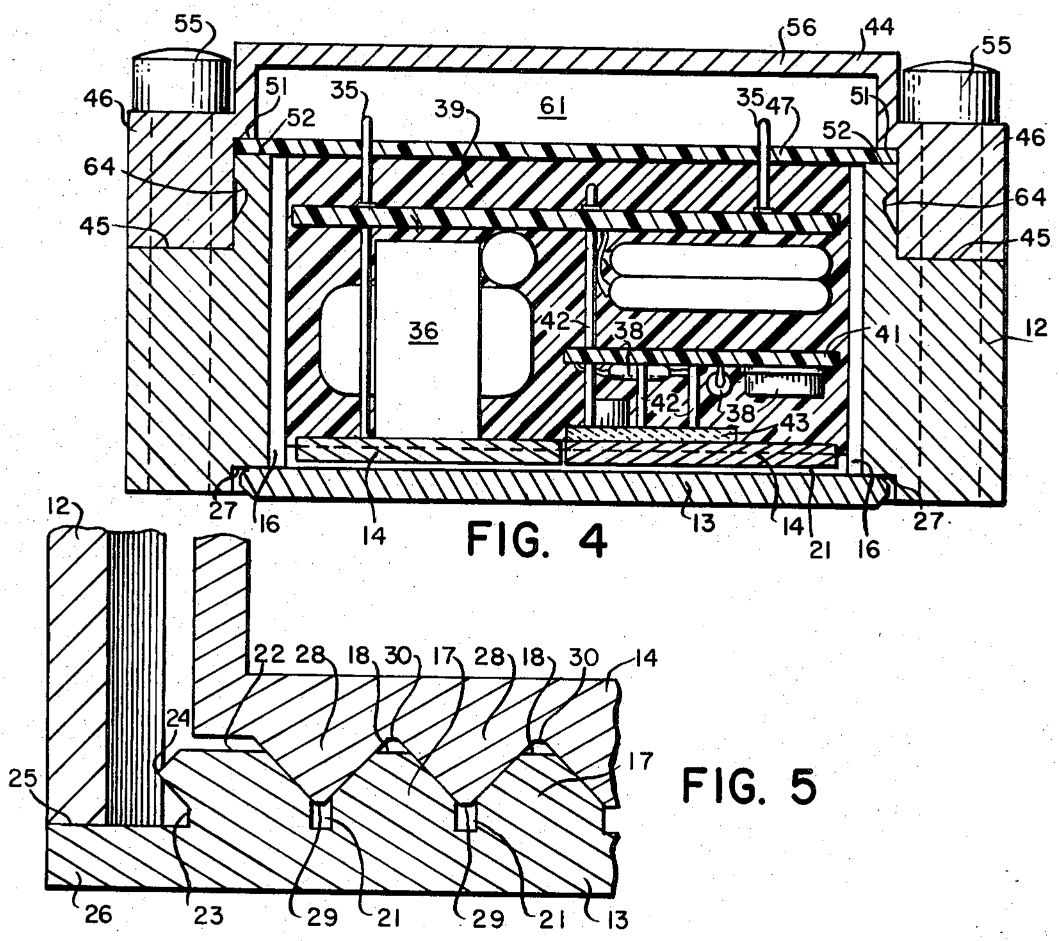
FIG. 4 is a side sectional view of an alternative embodiment of the invention taken through the cutting plane of 4—4 of FIG. 7 showing circuit components in a manner similar to FIG. 2.
FIG. 5 is a greatly enlarged partial sectional view of a portion of the base of FIG. 2 showing the cooperative fit between the housing, the base, and the carrier.

The primary structure of the invention is shown clearly in FIG. 5. Base 13 and carrier 14 are normally formed of substantially rigid electrically conductive members and may be made of aluminum extrusions in the form shown and fitted together as is apparent from FIGS. 2, 5, and 6. Base 13 may be extruded to any convenient length and cut as desired. Furthermore, while serrations 17 on the upper surface of the base normally extend the full length thereof, these serrations may easily be removed for a short distance adjacent either end for any desired purpose such as fitting it to housing 12, or for other purposes. As shown, most of the upper surface of base 13 is formed with serrations 17, each having a flat outer land 18 and a relatively U-shaped channel 21 forming a groove between each of these serrations. The last serration on either side of the upper surface of base 13 is formed with a slightly wider land 22 and an undercut 23 forming a sharp edge 24. Except for edges 24, the entire top surface and bottom surface of base 13 is preferably hard anodized to form an electrically insulating ceramic coating on these surfaces. A flat surface 25 normally extends slightly beyond edge 24 on either side of the base member parallel to bottom surface 26 thereof. This upper surface 25 may be used for various mounting purposes and as shown in FIG. 5 provides a shoulder upon which the edge of housing 12 rests. As mentioned previously, a portion on either end of the upper surface of base 13 may be cleared of serrations 17 and that cleared area may be used to accommodate a portion of the under surface of housing 12, that under surface being an undercut 27 as shown in FIG. 4. As will be explained hereinbelow, undercut 27 may be used if desired but it is not necessary that housing 12 be thus formed.

Carrier 14 is formed with serrations 28 on its lower surface, each serration having a relatively flat outer land 29 and a relatively narrow flat valley 30 between each of the serrations. The serrations of carrier 14 are configured to mate with the serrations of base 13 so that the respective serrations on the base and carrier intermesh when the two elements are fitted together. It will be readily recognized that with serrations 17 anodized as explained above, normally electrically conductive carrier 14 is electrically isolated from normally electrically conductive base 13. Carrier 14 may be secured to base 13 in any one of several ways, the preferred manner being an epoxy bonding adhesive which is thermally conductive and secures together the metallic surface of the carrier and the ceramic surface of the base. With the configuration shown, a relatively thin layer of adhesive is applied to the serrations of either base 13 or carrier 14 and the carrier is then self-located with respect to the base and pressed into place. The pressure applied between these two elements is preferably sufficient to make the spacing between the surfaces of serrations 17 and 28 very small and any excess adhesive is squeezed into U-shaped channels 21 and also into the gap between lands 18 and the base of grooves 30. A circuit may be assembled on carrier 14 either before or after the carrier is mounted to the base. Furthermore, the carrier may be a single flat device or a U-shaped device having sides as shown in FIG. 6. It is, of course, possible that the serrations 28 of carrier 14 could be anodized instead of serrations 17 of base 13 to provide the same thermal and electrical characteristics to the combination. It is also possible that a separate coating or adhesive substance may also be used in place of anodizing.

By securing these elements together in this manner, several novel advantages are obtained. Although adhesive bonding between two metal surfaces and electronic assemblies is not new, such bonding normally takes place between two flat surfaces which is relatively uncontrollable and lacks repeatability for precision components. Furthermore, where flat surfaces are secured together inaccuracies and possible separations are likely to result from the presence of minute dirt particles between the surfaces and from shear stresses which occur due to environmental, thermal and other somewhat unpredictable conditions. It is readily apparent that this device suffers from none of these enumerated faults. The serrations operate as a registration feature to help locate the carrier with respect to the base and substantial precision and repeatability are readily available because of the particular configuration of these elements. The hard anodized surfaces of the base, while they may be slightly porous, are very durable and resistant to scratching or cutting so that electrical shorting through the ceramic layer is very unlikely. Furthermore, the adhesive material between the carrier and base tends to fill the interstices of this porous ceramic layer to thereby enhance the adhesive qualities. Because the surface is so durable, further advantages are obtained in the construction of modular circuits according to this invention. Assemblers need not be overly careful in handling or connecting together metal pieces of the module because the base is fully protected and will not easily be scratched.

The purpose of anodizing the bottom surface 26 of the base is primarily for looks. This element makes contact with any surface upon which the package rests and makes direct contact with the chassis to which it is mounted. Despite considerable shelf time, movement and use of the package, this hard anodized bottom surface always presents a neat and new looking appearance. Another advantage of the serrated surface configuration over an equivalent size flat surface is that the various sides of the serrations of the two elements may be squeezed closer together than would be permissible over a larger flat surface and there is increased surface area to provide heat conduction from one element to the other. The base is the primary heat conductor from the electronic components to the chassis and the electrically isolating but thermally conducting interface between the base and the carrier provides an extremely useful and efficient thermal path. It is normal for the electronic circuit components mounted on the carrier to be encapsulated by an epoxy 39 and which is similar to that used for adhesive purposes and this permits curing both epoxies at the same time.

The base member of this circuit package will normally be electrically tied to the chassis so that it is at ground potential. Of course, the anodized surfaces previously described effectively insulate any of the circuit components from the base, even those which might possibly be connected directly to the carrier in particular instances where that is desired and where the carrier may serve as a common connection but not ground. The particular configuration of the intermeshed serrations of the carrier and base provide a small amount of capacitive filtering of certain small amounts of radio frequency interference which may be present. The distances between the surfaces of the base and carrier are relatively small while the surface is relatively large thus creating a capacitive structure. In certain instances it may be necessary to provide greater RFI filtering and this would be done through a conventional LC circuit located within the module. RFI shielding is accomplished in other ways by certain embodiments of this invention and will be discussed hereinbelow.

A useful modular circuit package may be comprised of base member 13, carrier 14, which may include one or more carriers of either of the types shown in FIG. 6, and the circuits or subcircuits mounted to carrier 14 and properly protected by a suitable encapsulant such as epoxy. The heat generating components are connected in an appropriate physical way to the carrier so that the heat may be dissipated from these components through the carrier, the interface between the carrier and the base, through the base and into the chassis to which the base is mounted. The encapsulant will normally act as a minor heat conductor and distributor for those elements which do not generate significant amounts of heat.

As stated previously, the preferred embodiment of this invention includes housing 12 which is preferably a metallic extrusion of the shape shown having the top and bottom open, formed with internal serrations 16 having relatively sharp points extending therethrough. Each end of the housing includes key-shaped slots 15 which have multiple functions as will later become apparent. Base 13 may be mounted to housing 12 which has been formed with an undercut 27 as shown in FIGS. 1–5. The undercut is not necessary and the base member may be mounted to housing 12 so that it protrudes below its bottom surface if desired. The margins of the base member which do not include serrations provide surfaces to which the bottom edges of the housing may be secured. The base may be secured to the housing by suitable means such as brazing or it may be secured at the same time that the circuit components within the housing, and consequently the carriers included therein, are potted by the encapsulant. This encapsulant will flow through any cracks or crevices in the circuit, including those between the edges of the housing and the margins of the base, to thereby secure these two members together when the encapsulant is cured. Referring to FIG. 5, it may be seen that edges 24 on either side of base member 13 are separated by a distance which is slightly greater than the distance between the points of serrations 16 in housing 12. A force fit is then generated between these two members so that when the base member is snapped into the housing, the sharp points of serrations 16 will bite into edges 24 of the outermost serration of the base member as shown in exaggerated form in FIG. 5. These members are thus physically connected together but even more important a positive electrical contact is made between these two elements. As stated previously, edges 24 are not hard anodized so that this electrical contact and the physical force-fit are permitted.

Because the base and housing will normally be metal extrusions, certain tolerances and inaccuracies will necessarily occur. By the use of the structure disclosed, these slight inaccuracies are accounted for. Thus, edges 24 may not always be separated by the same distance. Furthermore, the points of serration 16 of the housing may be slightly differently spaced on opposite sides and on various extrusions. Because an interference fit is part of the structure and because of the undercut behind edge 24, any foreseeable inaccuracies are accounted for and there is always a proper fit between these two elements.

Figure 2:
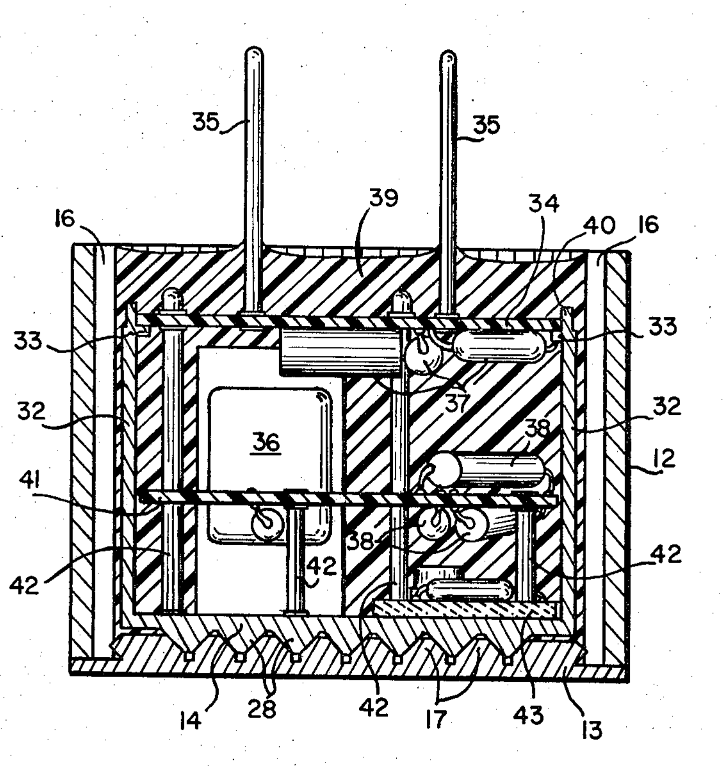
FIG. 2 is an enlarged sectional view taken through cutting plane 2—2 of FIG. 1 and showing examples of circuit components which could be a part of the package.
Figure 3:
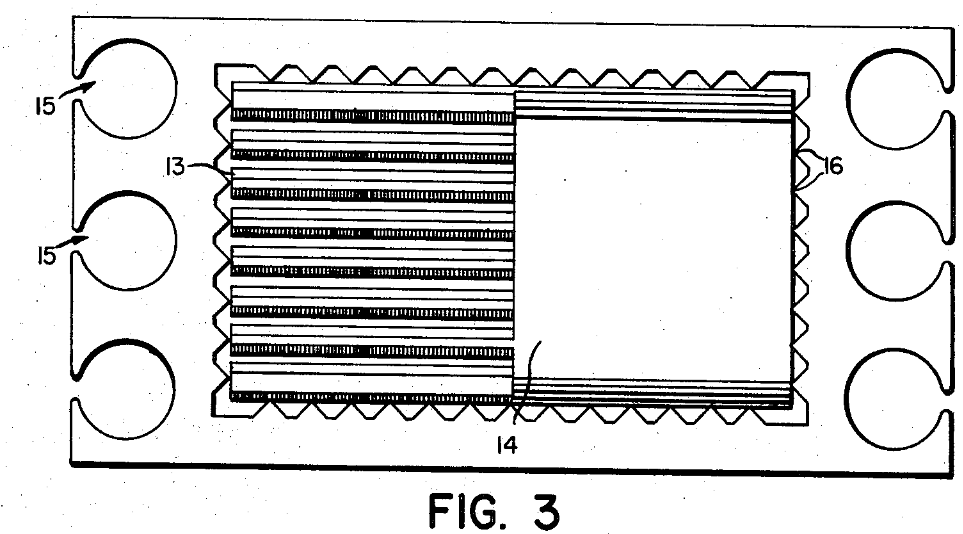
FIG. 3 is a plan view of the housing, base and carrier elements of FIG. 1 with all of the circuit components removed.

Further with respect to the package including housing 12, it may be seen from FIGS. 2 and 4 that one or more carrier elements and consequently one or more sub-circuits may be enclosed within the housing, mounted to base member 13. The carrier is slightly narrower in width as shown in FIG. 2 than the interior wall of the housing so that there is no physical contact between these two elements. Furthermore, FIG. 4 shows that the sub-circuits on two carriers are physically separated by a short distance thereby permitting these two circuits to be electrically and physically independent. It may be observed that the sub-circuits may be comprised of several different electronic circuit components 36, 37 and 38. A circuit board 34 may be used for appropriate interconnection of the sub-circuits within the housing to form a single power package. It should also be noted that in some modules there may be circuit boards 41 within the carrier to interconnect various of the circuit components in certain portions of the package. In some cases it may be desired to use riser pins 42 which physically retain the circuit boards of the package in their proper location with respect to the other components, some of these risers extending throughout the entire height of the carrier/sub-circuit section while others extend only a portion of that distance.

As shown in FIGS. 2 and 6, carrier 14 is normally provided with sidewalls 32 having shoulders 33 at the tops thereof. In most configurations, the circuit board 34 at the top of the carrier rests upon shoulders 33. In some instances, it may be desired to remove a portion of the top of sides 32 of carrier 14 leaving only spaced tab portions 33'. This configuration is most likely to occur in cases where certain of the circuit components are to be connected electrically to the carrier so that the carrier becomes a common potential tie point for a portion of the circuit and therefore electrical connection may be desired between the carrier and some portion of the circuit board. In these instances, the circuit board is metalized adjacent an edge area in such a way as to make contact with the protruding tab 33' at the top of the carrier, that portion making contact with these tabs normally being cutout areas of the circuit board. It should be recognized that these cutout areas and tabs also act as locating devices for the circuit board with respect to the carrier. In the instances where it is desired to make electrical contact with the tabs thus formed at the top of the carrier, the metallized portion of the circuit board extends relatively close to the sides of the housing. For this reason, top extension 40 of the carrier walls is indented from the outside plane of the side walls 32 so that this contact may be made without any danger of short circuiting the circuit board to the housing 12. In the instances where the carriers 14 have no side walls 32 as shown in FIG. 6, the circuit boards 34 and 41 would be supported entirely by the circuit components and risers 42 as necessary.

Another significant feature which affords even greater usefulness and flexibility together with enhanced heat dissipation for this invention is the use of thermally conductive but electrically insulating pads 43. These pads are preferably comprised of beryllia or alumina and will normally be secured directly to a surface of the carrier on one side while the other side makes direct contact with a heat generating circuit component. In this context, thermally conductive is taken to mean the relatively high thermal conductivity normally characteristic of metals such as aluminum and copper. The surfaces or appropriate portions thereof of pads 43 are metallized for contact with the carrier and with a desired circuit component and provide direct thermal paths from the component to the carrier while at the same time maintaining complete electrical isolation of the component from the carrier. These thermally conductive pads are preferably used for high heat generating components such as power transistors so that these elements may be thermally connected directly in a path which provides optimal heat dissipation. Those components not connected either directly to the carrier or to the carrier through pads 43 will normally be substantially non-heat generating components which require no more heat dissipation than would be provided by the encapsulant. Through the use of pads 43, it may be seen that although there is no electrical contact between such elements such as transistors to the carrier, there is an effective thermal path directly from these elements through the carrier to the base and consequently to the chassis.

The circuit which is constructed within housing 12 as described above is normally provided with external leads 35 projecting upward from circuit board 34. In some instances, these leads may be a continuation of risers 42 but most likely they will be pins connected only to the top circuit boards and appropriately electrically interconnected with the circuit.

With respect to the structure of housing 12, another advantage of the serrations 16 on the interior surfaces thereof is that when the encapsulant is applied to the completed circuit package, it makes a very firm mechanical bond to these side walls. This is in contrast to making similar contact with smooth surfaces which would then be subject to various shear stresses, particularly those due to thermal environmental conditions. This mechanical bond additionally assures an extremely good environmental seal against moisture because there is substantially no tendency for the encapsulant to in any way separate from the side walls as might be the case if the walls were smooth.

Slots 15, as previously mentioned, have several useful purposes. Primarily, these slots provide clear holes for bolts which extend through them and into the chassis for mounting the module thereto. Such connection is not only mechanical but is electrical for both the housing and the base. Bolts through these holes may also be used to secure other elements to the housing, as will become clear hereinbelow. Another purpose of slots 15 is to act as cooling fins by means of conduction through the bolts extending therethrough to the chassis and by radiation and convection with regard to those slots not occupied by bolts. The flexibility of this invention is further enhanced by the formation of multiple slots 15 which enables some to be used for mounting purposes, some to be used for heat dissipation purposes and some to be used for attachment of other hardware. A further feature of slots 15 is that they are dimensioned to provide clearance holes for conventional bolts such as six thirty-seconds size and additionally these slots may be fitted with tight fitting coil sleeves to provide threads for connecting other elements to housing 12 without passing entirely through the slots.

An alternative embodiment of this invention is depicted in FIGS. 4 and 7. Several housing packages 12 or modules may be connected together in side by side abutting relation as shown in FIG. 7, FIG. 4 being a cross section thereof through one module. Housing 12 is modified for this embodiment in that a portion at either end in the vicinity of slots 15 is removed forming shoulder 45 which accommodates side 46 of cover 44. Cover 44 is formed in the section shown in FIG. 4 and may be extruded in this sectional configuration having a top 56 to provide clearance above sub-circuits mounted within the housings 12. In this embodiment, a further circuit board 47 is placed across the top of the modules. This circuit board rests upon top surface 52 of housings 12 and is secured between shoulders 51 of the cover and top surfaces 52 as shown in FIG. 4. Bolts 55 may be used either to secure cover 44 to housing 12 or they may pass entirely through and thereby be used to secure the entire structure to a chassis. It should be noted that cover 44 extends throughout the length of these several modules which are secured together and an end 61 is also provided either as a separate panel secured between the top surface of the end module and the extremity of top 44 or as a flap on the ends of housing 44 which are bent down to make contact with and secured to the end module. Electrically insulating feedthrough terminals 62 may be provided for external connections to the power circuit package thus formed.

Figure 1:
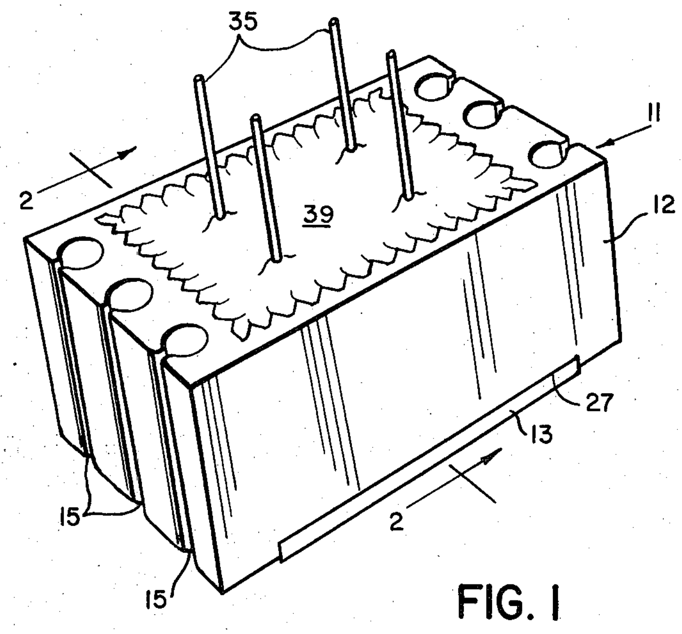
FIG. 1 is a perspective view of a preferred embodinment of the modular circuit package of this invention.

External leads 35 in this configuration are substantially shorter than those shown in FIGS. 1 and 2 so that they merely make contact with appropriate portions of the printed circuitry on circuit board 47. Additional electrical conductors may then be applied to circuit board 37 to lead out to feedthroughs 62.

It should be noted that with the embodiment of FIGS. 1 and 2 there is significant RFI shielding provided by the modular circuit package. The circuits within the package are enclosed by metal on five of the six sides and the circuit is well within the enclosure. The embodiment of FIGS. 4 and 7 provides substantially total RFI shielding because the electronic circuits are totally enclosed within metallic elements. A further adaptation of the FIG. 7 embodiment includes cooling fin element 63. This may be used in instances where the complete power system is not mounted to a chassis base-downward but may be mounted in some other way. These cooling fins provide additional heat dissipation for the power circuit package combining several circuit modules.

When the modular circuit package of FIG. 1 is mounted to a chassis, the electrical connection is primarily through mounting bolts but the major physical and therefore thermal connection is primarily through the base 13. In cases where there is no undercut 27 formed in housing 12, base 13 will extend below the bottom of the housing and will very firmly contact the chassis due to the action of the mounting bolts in slots 15. In cases where undercut 27 is employed to recess base 13, the undercut is made slightly less shallow than the thickness of the base so that even in those instances, base 13 extends slightly below the bottom of the housing. This is to provide as the primary thermal path the direct connection from heat generating electronic components through the carrier and base to the chassis. Of course some thermal dissipation will also occur through the housing as previously set forth.

With reference to FIG. 4 it may be seen how a module may be other than base-mounted. Indentations 64 are provided on the outer sides of housing 12 near the top thereof. In this figure the indentations are shown with the multiple module embodiment but they may be used with the unmodified housing of FIG. 1. Clips of appropriate configuration are then provided in an opening in a vertical chassis or mounting board which are adapted to engage these indentations and thus hold the module in place when pushed, top first, through the thus equipped opening.

In cases where housing 12 is not used (FIG. 6), it is most likely that the bottom surface of base 13 will not be anodized so that both physical and electrical contact may be made with the chassis through the base. Alternatives are of course available in that short bolts may be used to attach the base to the chassis and thereby provide the necessary electrical contact. It should be noted that although the anodized surface is a good electrical insulator, it is sufficiently thin to have substantially no adverse effect upon heat conduction. The layer of the ceramic formed by anodization is in the range of 0.25 mils thick. For reference purposes, the adhesive between base 13 and carrier 14 will be in the vicinity of 1 mil thick. It is thus apparent that there is substantially direct contact between the metallic structural elements and the chassis which is normally the primary heat distributor and dissipator. It will be noted that substantially all of the metallic elements specified as part of the primary or alternative structure of this invention are preferably aluminum extrusions. It is relatively inexpensive to thus fabricate a highly effective miniaturized power circuit package because of the cost-cutting effectiveness of this type of structure. The housing 12, base 13, carrier 14, cover 44, and cooling fin element 63 may all be extruded in indefinite lengths and cut as desired to make the appropriate structural configurations. As previously noted, certain portions of base 13 may be cleared of serrations 17 for appropriate mechanical contact with the housing 12.

Figure 8:
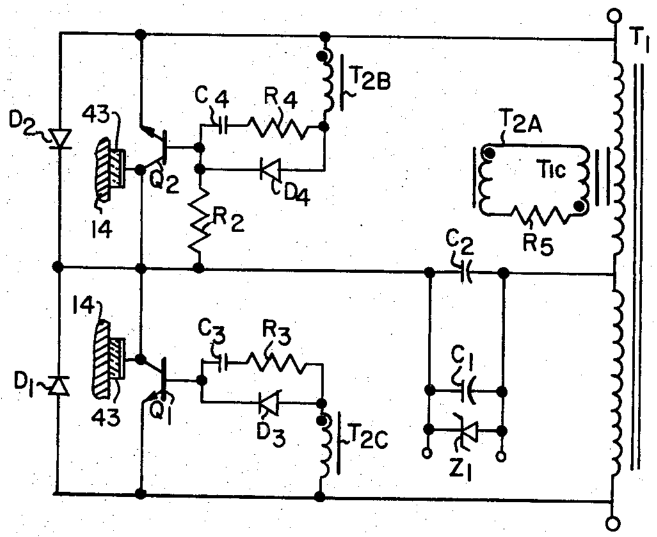
FIG. 8 is a schematic diagram of a sample circuit which could be a part of the modular circuit package of this invention.

With reference now to an example of the modular circuit which may be mounted within package 11 and specifically within one carrier 14, reference is made to FIGS. 2, 4, and 8. Sample elements are shown in FIGS. 2 and 4 including a transformer 36 and other electronic components 37 and 38. The circuit boards which may be needed or desired have previously been discussed, as have been thermally conductive but electrically insulating pads 43. The circuit shown in FIG. 8 is a high power inverter and transistors Q1 and Q2 are shown connected to two pads 43. It is possible that the collectors of these two transistors may be connected to separately metallized portions of the same pad 43 if desired. The remainder of the circuit of FIG. 8 is mounted within a carrier as depicted in FIG. 2. Examples of other circuits which may be used with this invention are AC to DC converters and regulated converters, DC to high frequency AC to DC inverters, linear power amplifiers and high frequency AC to DC converters. Of course many other power circuits could be used as a part of this invention.

It may thus be seen that this invention provides a very good combination of thermal dissipation, electrical isolation, is repeatable and reliable in construction and is relatively inexpensive. An alternative embodiment related to repeatability and registration could use a waffle pattern in place of the serrations on the carrier and base. Other modifications, improvements and changes will like occur to those skilled in the art which are within the scope of this invention.

What is claimed is:

1. A modular circuit package comprising:

a base member having a substantially flat outer surface and a serrated inner surface spaced from and parallel to said outer surface;

a carrier mounted to said base member, said carrier having a serrated outer surface and a substantially flat inner surface generally parallel to and spaced from said outer surface, said serrations thereon meshing with the serrations on said spaced member;

a relatively thin layer of electrically insulating material between and separating said base member from said carrier; and electronic components comprising a modular circuit mounted to said carrier.

2. The modular circuit package recited in claim 1 wherein said electrically insulating layer comprises an anodized coating on one of said serrated surfaces.

3. The modular circuit package recited in claim 2 and further comprising at least one circuit board for interconnection of some of said electronic components.

4. The modular circuit package recited in claim 3 and further comprising external electrical leads extending upwardly therefrom, said leads being connected to said modular circuit.

5. The modular circuit package recited in claim 1 wherein said serrations on said base member are formed with relatively straight generally inwardly extending sides formed at an angle with said outer surface thereof, two of said generally inwardly extending adjacent sides being joined by a relatively narrow land, there being a U-shaped channel between each of said serrations joining the bases of two of said generally inwardly extending adjacent sides;

said serrations on said carrier are formed with relatively straight generally outwardly extending sides formed at an angle with said inner surface thereof, two of said generally outwardly extending adjacent sides being joined by a relatively narrow land, there being a relatively narrow flat groove between each of said serrations joining the bases of two of said generally outwardly extending adjacent sides;

whereby a space exists between the land on each serration of said base and the groove between each serration on said carrier and an open channel exists between said U-shaped channel between said serration on said base and said land on each said serration on said carrier.

6. The modular circuit package recited in claim 1 and further comprising at least one thermally conductive, electrically insulating pad secured to said carrier, at least one of said electronic components being mounted to said thermally conductive, electrically insulating pad thereby providing a direct path for heat dissipation from said component through said pad and said carrier to said base.

7. The modular circuit package recited in claim 1 and further comprising a housing mechanically and electrically connected to said base, said carrier and said modular circuit being physically and electrically separated from said housing and located therewithin.

8. The modular circuit package recited in claim 7 wherein the interior walls of said housing are formed with serrations having relatively sharp inner projecting peaks, said housing further being formed with external key-shaped slots at opposite sides thereof, said slots extending completely through said housing from top to bottom.

9. The modular circuit package recited in claim 8 wherein said base member is formed with marginal areas on its upper surface which are free of said serrations, said marginal areas making contact with peripheral portions of the bottom surface of said housing for physically mounting thereto, said serrations extending into said housing and making interference-fit contact with said housing serrations.

10. The modular circuit package recited in claim 9 wherein the outermost serrations on said base member adjacent said marginal areas are formed with a relatively sharp edge projecting laterally and an undercut between said marginal area and said serrations thereby providing flexibility of said relatively sharp laterally extending edge of said serrations wherein said serrations on the inner sides of said housing form an interference fit with said relatively sharp edges thereby making positive physical and electrical contact between said housing and said base.

11. The modular circuit package recited in claim 1 and further comprising an encapsulant of suitable material which is electrically insulating and has a thermal coefficient of expansion substantially similar to that of said base and carrier members, said encapsulant enclosing said electronic components to form a substantially solid mass.

12. The modular circuit package recited in claim 10 and further comprising an encapsulant of suitable material which is electrically insulating and has a thermal coefficient of expansion substantially similar to that of said enclosure, said encapsulant filling that portion of the interior of said enclosure not otherwise occupied by said modular circuit components.

13. The modular circuit package recited in claim 8 wherein said key-shaped slots are adapted to receive bolts for connecting said modular circuit package to other elements, said key-shaped slots being alternatively adapted for use as cooling fins.

14. A modular circuit package comprising:

a base member having a substantially flat outer surface and a serrated inner surface parallel with and spaced from said outer surface;

a plurality of carriers mounted to said base member, each said carrier having one serrated outer surface and one substantially flat inner surface parallel thereto and spaced therefrom, said serrations on said carriers meshing with the serrations on said base member;

means for electrically insulating said carriers from said base member; and electronic components comprising modular circuits mounted to each of said carriers.

15. The modular circuit package recited in claim 14 wherein said electrically insulating means is a coating of anodization on one of said serrated surfaces.

16. The modular circuit package recited in claim 15 and further comprising at least one circuit board coextensive with said plurality of carriers and interconnecting in an appropriate manner said circuits mounted to said individual carriers.

17. The modular circuit package recited in claim 16 wherein each of said carriers and said modular circuits mounted thereto are physically separated and electrically isolated from each of the other of said carriers and modular circuits except where appropriate interconnections are made by said circuit board.

18. The modular circuit package recited in claim 7 wherein two opposite walls of said housing are formed with indentations along said walls adjacent one end of said housing.

19. A modular circuit package comprising:

a plurality of housings each having an opening therethrough and having serrations on its internal walls;

a like plurality of base members having a substantially flat outer surface and a serrated inner surface parallel with and spaced from said outer surface, said base member being secured to said housing to substantially cover one open end thereof, said serrations on said base being closely adjacent said serrations on said housing walls;

a plurality of carriers each having one serrated surface and one substantially flat surface parallel thereto and spaced therefrom, said serrations on said carriers meshing with said serrations on said base members;

means electrically insulating said carriers from said base members;

electronic components comprising a plurality of modular circuits, one of said circuits being mounted to each of said carriers; and a cover secured to all of said housings, said housings being placed in abutting side by side relation to thereby form a single power modular circuit package comprised of said second plurality of sub-circuits.

20. The modular circuit package recited in claim 19 and further comprising a circuit board coextensive with the adjacent top surfaces of said plurality of housings, said circuit board being secured between said cover and said housings, said circuit board providing electrical interconnection for said sub-circuits within said housings.

* * * * *